(12) United States Patent
Gao

(10) Patent No.: US 9,818,668 B2
(45) Date of Patent: Nov. 14, 2017

(54) THERMAL VIAS DISPOSED IN A SUBSTRATE WITHOUT A LINER LAYER

(71) Applicant: Invensas Corporation, San Jose, CA (US)

(72) Inventor: Guilian Gao, San Jose, CA (US)

(73) Assignee: Invensas Corporation, San Jose, CA (US)

(*) Notice: Subject to any disclaimer, the term of this patent is extended or adjusted under 35 U.S.C. 154(b) by 0 days.

(21) Appl. No.: 15/066,983

(22) Filed: Mar. 10, 2016

(65) Prior Publication Data

US 2016/0197026 A1 Jul. 7, 2016

Related U.S. Application Data

(62) Division of application No. 14/201,473, filed on Mar. 7, 2014, now Pat. No. 9,299,572.

(51) Int. Cl.

| H01L 23/32 | (2006.01) |
|---|---|
| H01L 23/367 | (2006.01) |
| H01L 23/48 | (2006.01) |
| H01L 21/768 | (2006.01) |
| H01L 21/306 | (2006.01) |
| H01L 21/311 | (2006.01) |
| H01L 21/308 | (2006.01) |
| H01L 21/321 | (2006.01) |

(Continued)

(52) U.S. Cl.
CPC ........ *H01L 23/3677* (2013.01); *H01L 21/308* (2013.01); *H01L 21/30604* (2013.01); *H01L 21/30625* (2013.01); *H01L 21/31111* (2013.01); *H01L 21/3212* (2013.01); *H01L 21/486* (2013.01); *H01L 21/4882* (2013.01); *H01L 21/76829* (2013.01); *H01L 21/76843* (2013.01); *H01L 21/76898* (2013.01); *H01L 23/481* (2013.01); *H01L 23/538* (2013.01); *H01L 2224/16145* (2013.01); *H01L 2224/16225* (2013.01); *H01L 2224/32225* (2013.01); *H01L 2224/73204* (2013.01); *H01L 2224/73253* (2013.01); *H01L 2924/15311* (2013.01); *H01L 2924/16152* (2013.01)

(58) Field of Classification Search
CPC ............... H01L 23/3677; H01L 23/538; H01L 21/4882; H01L 21/486; H01L 21/303
USPC ......... 257/774; 438/122, 637, 638, 667, 668
See application file for complete search history.

(56) References Cited

U.S. PATENT DOCUMENTS

| 6,222,276 B1 | 4/2001 | Bertin et al. |
|---|---|---|
| 7,834,461 B2 | 11/2010 | Asai et al. |
| 8,193,039 B2 | 6/2012 | Su et al. |

(Continued)

FOREIGN PATENT DOCUMENTS

WO   WO 2013/118618 A1   8/2013

OTHER PUBLICATIONS

International Search Report and Written Opinion for PCT/US2015/019520, dated Jul. 17, 2015.

*Primary Examiner* — Long K Tran

(57) ABSTRACT

A method relating generally to a substrate is disclosed. In such a method, the substrate has formed therein a plurality of vias. A liner layer is located on the substrate, including being located in a subset of the plurality of vias. At least one of the plurality of vias does not have the liner layer located therein. A thermally conductive material is disposed in the at least one of the plurality of vias to provide a thermal via structure.

20 Claims, 12 Drawing Sheets

(51) Int. Cl.
    *H01L 23/538*    (2006.01)
    *H01L 21/48*    (2006.01)

(56) References Cited

U.S. PATENT DOCUMENTS

| | | |
|---|---|---|
| 8,294,240 B2 | 10/2012 | Nowak et al. |
| 8,609,506 B2 | 12/2013 | Lin et al. |
| 8,791,575 B2 | 7/2014 | Oganesian et al. |
| 8,796,135 B2 | 8/2014 | Oganesian et al. |
| 8,816,505 B2 | 8/2014 | Mohammed et al. |
| 8,872,345 B2 | 10/2014 | Hsieh et al. |
| 8,969,200 B2 | 3/2015 | Hebding et al. |
| 9,257,322 B2 | 2/2016 | Chen et al. |
| 2012/0261805 A1 | 10/2012 | Sundaram et al. |
| 2013/0270711 A1* | 10/2013 | Hebding ............... H01L 21/768 257/774 |
| 2013/0342231 A1 | 12/2013 | Alfano et al. |
| 2015/0255364 A1 | 9/2015 | Gao |

* cited by examiner

THERMAL VIAS DISPOSED IN A SUBSTRATE WITHOUT A LINER LAYER

FIELD CROSS-REFERENCE TO RELATED APPLICATION(S)

This application is a divisional of, and hereby claims priority to, pending U.S. patent application Ser. No. 14/201, 473, filed on Mar. 7, 2014, the entirety of which is hereby incorporated by reference herein for all purposes.

FIELD

The following description relates to integrated circuits ("ICs"). More particularly, the following description relates to thermal vias disposed in a substrate without a liner layer for an IC.

BACKGROUND

Microelectronic assemblies generally include one or more ICs, such as for example one or more packaged dies ("chips") or one or more dies. One or more of such ICs may be mounted on a circuit platform, such as a wafer such as in wafer-level-packaging ("WLP"), printed board ("PB"), a printed wiring board ("PWB"), a printed circuit board ("PCB"), a printed wiring assembly ("PWA"), a printed circuit assembly ("PCA"), a package substrate, an interposer, or a chip carrier. Additionally, one IC may be mounted on another IC. An interposer may be an IC, and an interposer may be a passive or an active IC, where the latter includes one or more active devices, such as transistors for example, and the former does not include any active device. Furthermore, an interposer may be formed like a PWB, namely without any circuit elements such as capacitors, resistors, or active devices. Additionally, an interposer includes at least one through-substrate-via.

An IC may include conductive elements, such as pathways, traces, tracks, vias, contacts, pads such as contact pads and bond pads, plugs, nodes, or terminals for example, that may be used for making electrical interconnections with a circuit platform. These arrangements may facilitate electrical connections used to provide functionality of ICs. An IC may be coupled to a circuit platform by bonding, such as bonding traces or terminals, for example, of such circuit platform to bond pads or exposed ends of pins or posts or the like of an IC. Additionally, a redistribution layer ("RDL") may be part of an IC to facilitate a flip-chip configuration, die stacking, or more convenient or accessible position of bond pads for example. Conventionally, a stacked die or an individual die has issues with removing heat.

Accordingly, it would be desirable and useful to provide means to remove heat from a die stack or an individual die.

BRIEF SUMMARY

An apparatus relates generally to a substrate. In such an apparatus, the substrate has formed therein a plurality of vias. A liner layer is located on the substrate, including being located in a subset of the plurality of vias. At least one of the plurality of vias does not have the liner layer located therein. A thermally conductive material is disposed in the at least one of the plurality of vias to provide a thermal via structure.

A method relates generally to a substrate. In such a method, a first masking layer, deposited on an upper surface of the substrate, is patterned to define a plurality of openings. The substrate is etched through the plurality of openings to form corresponding via openings in the substrate. Each of the via openings include at least a sidewall surface and a base surface. The first masking layer is removed. A liner layer is deposited on the upper surface of the substrate and in the via openings on the sidewall surface and the base surface of each thereof. A second masking layer deposited on the liner layer is patterned to define at least one opening corresponding to at least one of the via openings. The at least one opening exposes a portion of the liner layer corresponding to the at least one of the via openings. The portion of the liner layer is etched to expose the sidewall surface and the base surface of the at least one of the via openings. The second masking layer is removed. A barrier layer is deposited on the liner layer and on the sidewall surface and the base surface of the at least one of the via openings. A thermally conductive material is deposited on the barrier layer. The thermally conductive material is deposited in the via openings to provide signal via structures and at least one thermal via structure.

BRIEF DESCRIPTION OF THE DRAWING(S)

Accompanying drawing(s) show exemplary embodiment (s) in accordance with one or more aspects of exemplary apparatus(es) or method(s). However, the accompanying drawings should not be taken to limit the scope of the claims, but are for explanation and understanding only.

DETAILED DESCRIPTION

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Figure 1A:
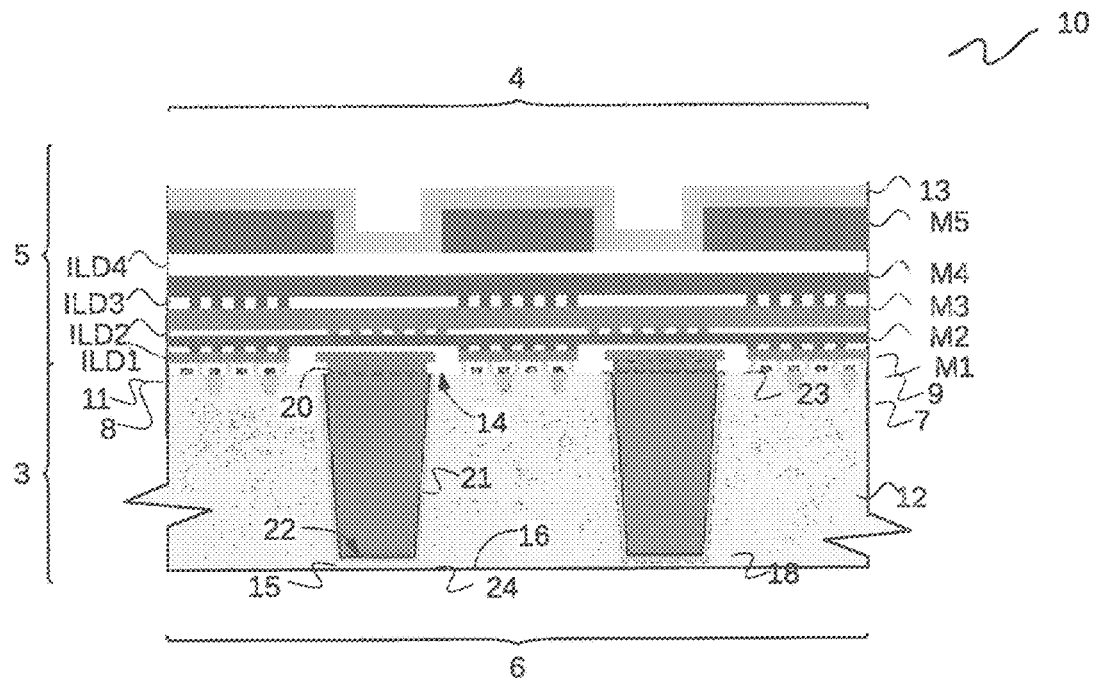
FIG. 1A is a schematic diagram of a cross-sectional view depicting an exemplary portion of an in-process wafer for providing an integrated circuit ("IC").

FIG. 1A is a schematic diagram of a cross-sectional view depicting an exemplary portion of an in-process wafer for providing an IC 10 component. IC 10 includes a substrate 12 of a semiconductor material such as silicon (Si), gallium arsenide (GaAs), polymeric, ceramic, carbon-based substrates such as diamond, a silicon carbon (SiC), germanium (Ge), $Si_{1-x}Ge_x$, or the like. Even though a semiconductor substrate 12 as provided from an in-process wafer is generally described below, any sheet or layer semiconductor material or dielectric material, such as ceramic or glass for example, may be used as a substrate. Furthermore, even though an IC 10 is described, any microelectronic component that includes one or more through-substrate via structures may be used.

Substrate 12 includes an upper surface 14 and a lower surface 16 that extend in lateral directions and are generally parallel to each other at a thickness of substrate 12. Use of terms such as "upper" and "lower" or other directional terms is made with respect to the reference frame of the figures and is not meant to be limiting with respect to potential alternative orientations, such as in further assemblies or as used in various systems.

Upper surface 14 may generally be associated with what is referred to as a "front side" 4 of an in-process wafer, and lower surface 16 may generally be associated with what is referred to as a "backside" 6 of an in-process wafer. Along those lines, a front-side 4 of an in-process wafer may be used for forming what is referred to as front-end-of-line ("FEOL") structures 3 and back-end-of-line ("BEOL") structures 5. Generally, FEOL structures 3 may include shallow trench isolations ("STI") 7, transistor gates 8, transistor source/drain regions (not shown), transistor gate dielectrics (not shown), contact etch stop layer ("CESL"; not shown), a pre-metallization dielectric or pre-metal dielectric ("PMD") 11, and contact plugs 9, among other FEOL structures. A PMD 11 may be composed of one or more layers. Generally, BEOL structures 5 may include one or more inter-level dielectrics ("ILDs") and one or more levels of metallization ("M"). In this example, there are four ILDs, namely ILD1, ILD2, ILD3, and ILD4; however, in other configurations there may be fewer or more ILDs. Furthermore, each ILD may be composed of one or more dielectric layers. In this example, there are five levels of metallization, namely M1, M2, M3, M4, and M5; however, in other configurations there may be fewer or more levels of metallization. Additionally, metal from a metallization level may extend through one or more ILDs, as is known. Furthermore, each level of metallization may be composed of one or more metal layers. A passivation level 13 may be formed on a last metallization layer. Such passivation level 13 may include one or more dielectric layers, and further may include an anti-reflective coating ("ARC"). Furthermore, a redistribution layer ("RDL") may be formed on such passivation level. Conventionally, an RDL may include: a dielectric layer, such as a polyimide layer for example; another metal layer on such dielectric layer and connected to a bond pad of a metal layer of a last metallization level; and another dielectric layer, such as another polyimide layer for example, over such RDL metal layer while leaving a portion thereof exposed to provide another bond pad. A terminal opening may expose such other bond pad of such RDL metal layer. Thereafter, a solder bump or wire bond may be conventionally coupled to such bond pad.

As part of a FEOL or BEOL structure formation, a plurality of via structures 18 may extend within openings formed in substrate 12 which extend into substrate 12. Via structures 18 may be generally in the form of any solid of any shape formed by filling an opening formed in substrate 12. Examples of such solid shapes generally include cylindrical, conical, frustoconical, rectangular prismatic, cubic, or the like. Examples of openings for via structures, vias, and processes for the fabrication thereof, may be found in U.S. patent application Ser. No. 13/193,814 filed Jul. 29, 2011, and U.S. patent application Ser. Nos. 12/842,717 and 12/842,651 both filed on Jul. 23, 2010, and each of these patent applications is hereby incorporated by reference herein for all purposes to the extent same is consistent with the description hereof.

Conventionally, via structures 18 may extend from upper surface 14 down toward lower surface 16, and after a backside reveal, via structures 18 may extend between surfaces 14 and 16, as effectively thickness of substrate 12 may be thinned so as to reveal lower end surfaces of via structures 18, as described below in additional detail. Via structures 18 extending through substrate 12 between surfaces 14 and 16, though they may extend above or below such surfaces, respectively, may be referred to as through-substrate-vias. As substrates are often formed of silicon, such through-substrate-vias are commonly referred to as TSVs, which stands for through-silicon-vias.

Such openings formed in substrate 12 may be conformally coated, oxidized, or otherwise lined with a liner or insulator 15. Conventionally, liner 15 is silicon dioxide; however, a silicon oxide, a silicon nitride, or another dielectric material may be used to electrically isolate via structures 18 from substrate 12. Generally, liner 15 is an insulating or dielectric material positioned between any and all conductive portions of a via structure 18 and substrate 12 such that an electronic signal, a ground, a supply voltage, or the like carried by such via structure 18 is not substantially leaked into substrate 12, which may cause signal loss or attenuation, shorting, or other circuit failure.

Overlying a liner 15 may be a barrier layer 24. Generally, barrier layer 24 is to provide a diffusion barrier with respect to a metallic material used to generally fill a remainder of an opening in which a via structure 18 is formed. Barrier layer 24 may be composed of one or more layers. Furthermore, a barrier layer 24 may provide a seed layer for subsequent electroplating or other deposition, and thus barrier layer 24 may be referred to as a barrier/seed layer. Moreover, barrier layer 24 may provide an adhesion layer for adherence of a subsequently deposited metal. Thus, barrier layer 24 may be a barrier/adhesion layer, a barrier/seed layer, or a barrier/ adhesion/seed layer. Examples of materials that may be used for barrier layer 24 include tantalum (Ta), tantalum nitride (TaN), palladium (Pd), titanium nitride (TiN), TaSiN, compounds of Ta, compounds of Ti, compounds of nickel (Ni), compounds of copper (Cu,), compounds of cobalt (Co), or compounds of tungsten (W), among others.

Via structures 18 may generally consist of a metallic or other conductive material generally filling a remaining void in an opening formed in substrate 12 to provide a via conductor 21. In various examples, a via conductor 21 of a via structure 18 may generally consist of copper or a copper alloy. However, a via conductor 21 may additionally or alternatively include one or more other conductive materials such as tantalum, nickel, titanium, molybdenum, tungsten, aluminum, gold, silver, or solder, including various alloys or compounds of one or more of the these materials, and the like. A via conductor 21 may include non-metallic additives to control various environmental or operational parameters of a via structure 18.

Via structures 18 may each include an upper end contact surface 20 which may be level with upper surface 14 of substrate 12 and a lower end contact surface 22 which may be level with lower surface 16 of substrate 12 after a backside reveal. End surfaces 20 and 22 may be used to interconnect via structures 18 with other internal or external components, as below described in additional detail.

In this example, upper end contact surface 20 of via conductors 21 are interconnected to M1 through a respective contact pad 23. Contact pads 23 may be formed in respective openings formed in PMD 11 in which M1 extends. However, in other configurations, one or more via conductors 21 may extend to one or more other higher levels of metallization through one or more ILDs. Furthermore, via structure 18 is what may be referred to as a front side TSV, as an opening used to form via structure is initially formed by etching from a front side of substrate 12.

Figure 1B:
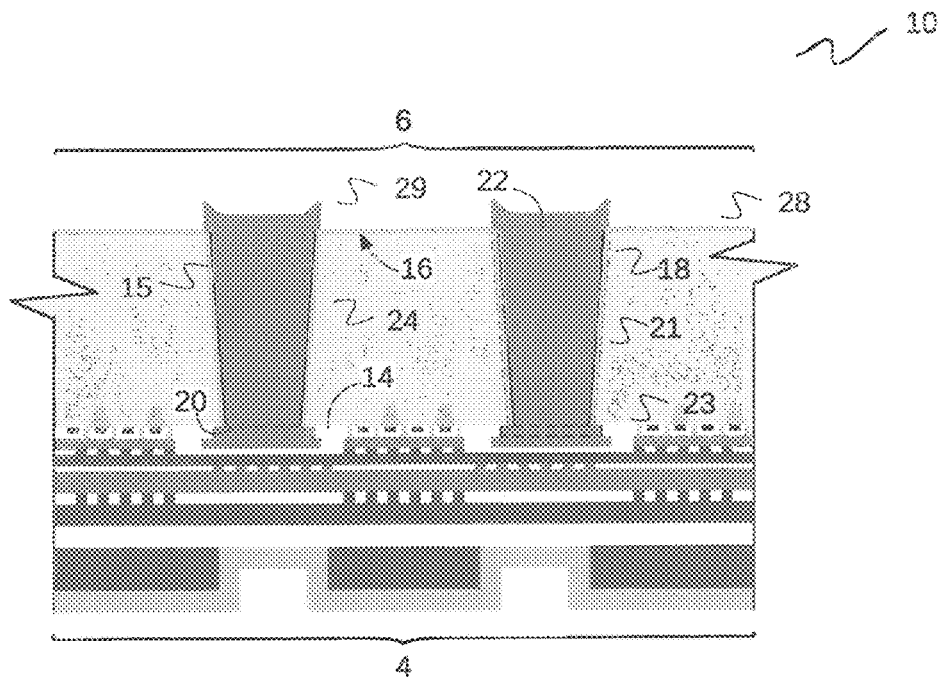
FIG. 1B is a schematic diagram of a cross-sectional view depicting an exemplary portion of an in-process wafer for providing another IC.

However, a via structure may be a backside TSV, as generally indicated in FIG. 1B, where there is shown a schematic diagram of a cross-sectional view depicting an exemplary portion of an in-process wafer for providing another IC 10. Fabrication of a backside TSV is generally referred to as a "via last approach," and accordingly fabrication of a front side TSV is generally referred to as a "via first approach." Furthermore, a "via middle approach" may be used. A "via middle approach" is likewise a front side approach to via formation, but referred to as "middle" as vias are made after FEOL operations, but before BEOL operations.

IC 10 of FIG. 1B includes a plurality of via structures 18, which are backside TSVs. For a backside TSV for via structure 18, liner 15 may be a deposited polymer into a "donut" silicon trench etch and deposited on lower surface 16 as a passivation layer 28, followed by a central silicon trench etch to remove an inner portion of the "donut" silicon trench, and followed by a seed layer deposition before patterning and electroplating to provide via conductors 21 having respective solder bump pads or landings 29. Optionally, a conventional anisotropic silicon etch may be used prior to depositing and patterning a polymer isolation layer as liner 15.

For purposes of clarity by way of example and not limitation, it shall be assumed that front side TSVs are used, as the following description is generally equally applicable to backside TSVs.

Figure 1C:
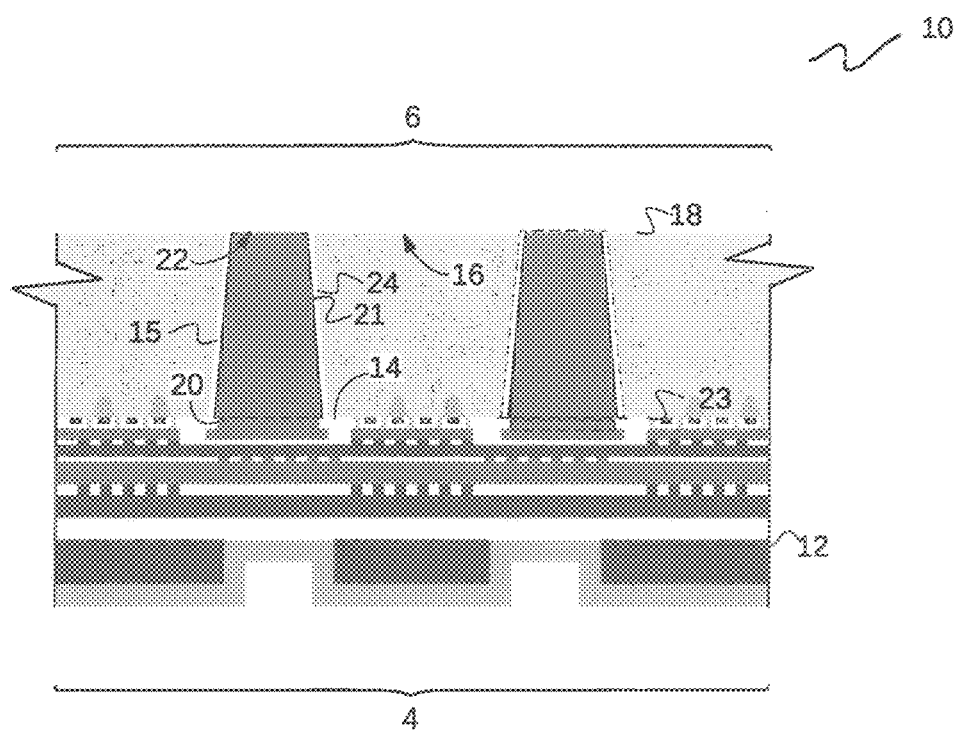
FIG. 1C is the diagram of FIG. 1A with the IC vertically flipped after chemical-mechanical-polishing of a lower surface of a substrate of the IC.

FIG. 1C is the diagram of FIG. 1A with IC 10 after a chemical-mechanical-polishing ("CMP") of a lower surface 16 of a substrate 12. Such CMP may be performed to temporarily reveal lower end contact surface 22, and thus portions of liner 15 and barrier layer 24 previously underlying lower end contact surface 22 may be removed by CMP. Thus, in this example, lower end contact surface 22 may be coplanar and level with lower surface 16.

Figure 1D:
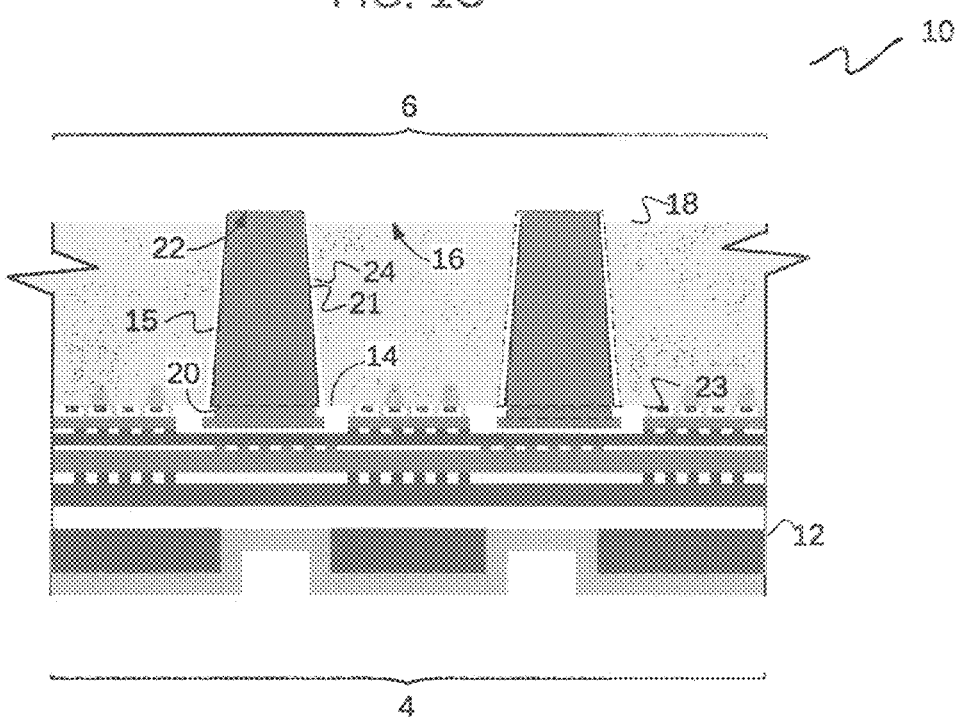
FIG. 1D is the diagram of FIG. 1A with the IC vertically flipped after a backside etch of a lower surface of a substrate of the IC to reveal a lower end contact surface of a via conductor thereof.

FIG. 1D is the diagram of FIG. 1A with IC 10 after a backside etch of a lower surface 16 of substrate 12 to temporarily reveal a lower end contact surface 22 of a via conductor 21. In this example, lower end contact surface 22 may be coplanar with lower surface 16; however, as via conductor 21, and optionally barrier layer 24, may protrude from substrate 12 after a backside reveal etch, lower end contact surface 22 in this example is not level with lower surface 16. For purposes of clarity and not limitation, IC 10 of FIG. 1D shall be further described, as the following description may likewise apply to IC 10 of FIG. 1C.

Figure 1E:
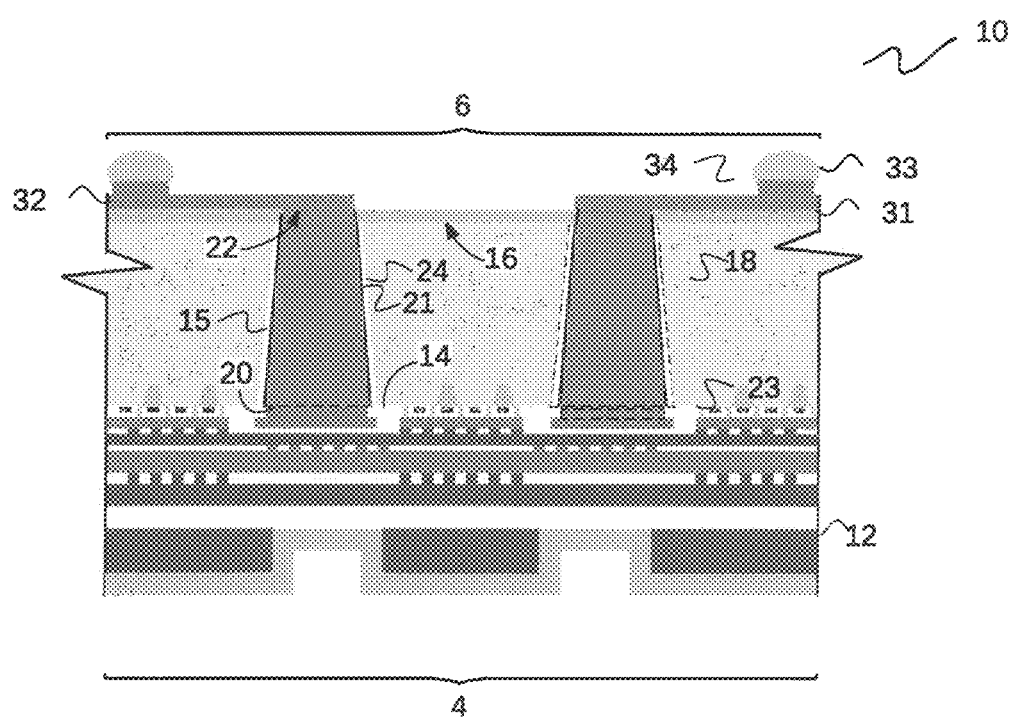
FIG. 1E is the diagram of FIG. 1D with a lower surface of the IC having formed thereon a passivation layer, which may be formed of one or more dielectric layers.

FIG. 1E is the diagram of FIG. 1D with a lower surface 16 of a substrate 12 having formed thereon a passivation layer 31, which may be formed of one or more dielectric layers. Furthermore, passivation layer 31 may be a polymer layer. For example, passivation layer 31 may be a benzocyclobutene ("BCB") layer or a combination of a silicon nitride layer and a BCB layer. In some applications, passivation layer 31 may be referred to as an inter-die layer. A metal layer 32, such as an aluminum, a copper, copper alloy, or other metal previously described, may be formed on passivation layer 31 and on lower end contact surfaces 22 of via conductors 21. This metal layer 32 may be an RDL metal layer. Balls 33 may be respectively formed on bonding pads 34, where such pads may be formed on or as part of metal layer 32. Balls 33 may be formed of a bonding material, such as solder or other bonding material. Balls 33 may be microbumps, C4 bumps, ball grid array ("BGA") balls, or some other die interconnect structure. In some applications, metal layer 32 may be referred to as a landing pad.

More recently, TSVs have been used to provide what is referred to as three-dimensional ("3D") ICs or "3D ICs." Generally, attaching one die to another using, in part, TSVs may be performed at a bond pad level or an on-chip electrical wiring level. ICs 10 may be diced from a wafer into single dies. Such single dies may be bonded to one another or bonded to a circuit platform, as previously described. For purposes of clarity by way of example and not limitation, it shall be assumed that an interposer is used for such circuit platform.

Interconnection components, such as interposers, may be in electronic assemblies for a variety of purposes, including facilitating interconnection between components with different connection configurations or to provide spacing between components in a microelectronic assembly, among others. Interposers may include a semiconductor layer, such as of silicon or the like, in the form of a sheet or layer of material or other substrate having conductive elements such as conductive vias extending within openings which extend through such layer of semiconductor material. Such conductive vias may be used for signal transmission through such interposer. In some interposers, ends of such vias may be used as contact pads for connection of such interposer to other microelectronics components. In other examples, one or more RDLs may be formed as part of such interposer on one or more sides thereof and connected with one or both ends of such vias. An RDL may include numerous conductive traces extending on or within one or more dielectric sheets or layers. Such traces may be provided in one level or in multiple levels throughout a single dielectric layer, separated by portions of dielectric material within such RDL. Vias may be included in an RDL to interconnect traces in different levels of such RDL.

Figure 2A:
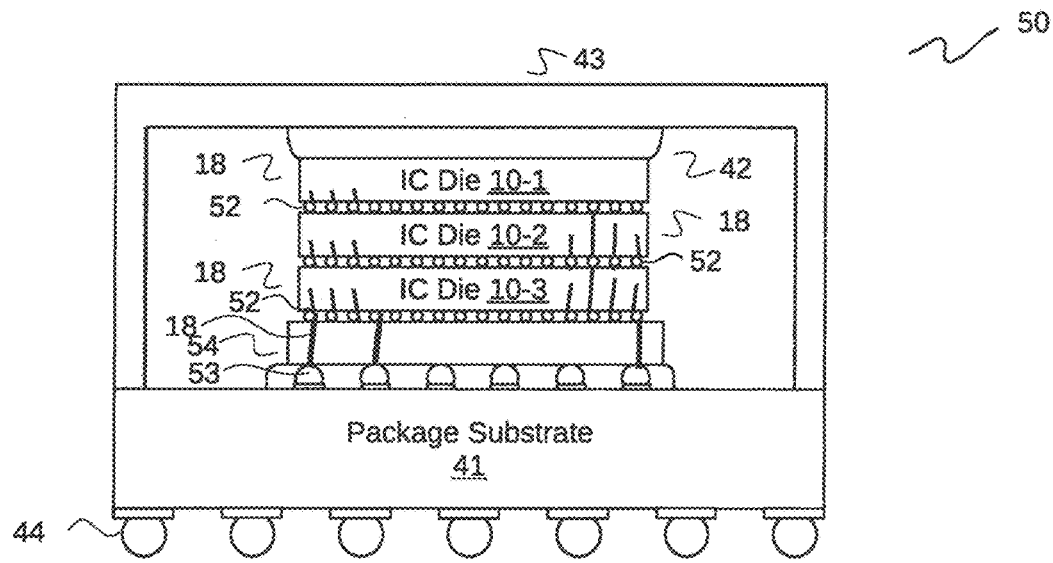
FIG. 2A is a block diagram of a cross-sectional view depicting an exemplary three-dimensional ("3D") IC packaged component with via structures.

FIG. 2A is a block diagram of a cross-sectional view depicting an exemplary 3D IC packaged component 50 with via structures 18. While a stacked die or a package-on-package die may include TSV interconnects, use of via structures 18 for a 3D IC packaged component 50 is described for purposes of clarity by way of example. In this example of a 3D IC packaged component 50, there are three ICs 10, namely ICs 10-1, 10-2, and 10-3, stacked one upon the other. In other implementations, there may be fewer or more than three ICs 10 in a stack. ICs 10 may be bonded to one another using microbumps 52 or flip-chip solder bumps. Optionally, Cu pillars extending from a backside of a die may be used. Some of these microbumps 52 may be interconnected to via structures 18. For example, a Cu/Sn microbump transient liquid phase ("TLP") bonding technology may be used for bonding ICs to one another. Thus, interconnect layers may be on one upper or lower side or both upper and lower sides of an IC 10 of a 3D stack.

A bottom IC 10-3 of such ICs in a 3D stack optionally may be coupled to an interposer or interposer die 40. Interposer 40 may be an active die or a passive die. For purposes of clarity and not limitation, it shall be assumed that interposer 40 is a passive die. IC 10-3 may be coupled to interposer 40 by microbumps 52. Interposer 40 may be coupled to a package substrate 41. Package substrate 41 may be formed of thin layers called laminates or laminate substrates. Laminates may be organic or inorganic. Examples of materials for "rigid" package substrates include an epoxy-based laminate such as FR4, a resin-based laminate such as bismaleimide-triazine ("BT"), a ceramic substrate, a glass substrate, or other form of package substrate. An under fill 54 for a flip chip attachment may encapsulate C4 bumps or other solder balls 53 used to couple interposer 40 and package substrate 41. A spreader/heat sink ("heat sink") 43 may be attached to package substrate 41, and such heat sink 43 and substrate package 41 in combination may encase ICs 10 and interposer 40 of such 3D stack. A thermal paste 42, commonly referred to as thermal interface material ("TIM"), may couple an upper surface of IC 10-1 on top of such 3D stack to an upper internal surface of such heat sink 43. Ball grid array ("BGA") balls or other array interconnects 44 may be used to couple package substrate 41 to a circuit platform, such as a PCB for example.

Figure 2B:
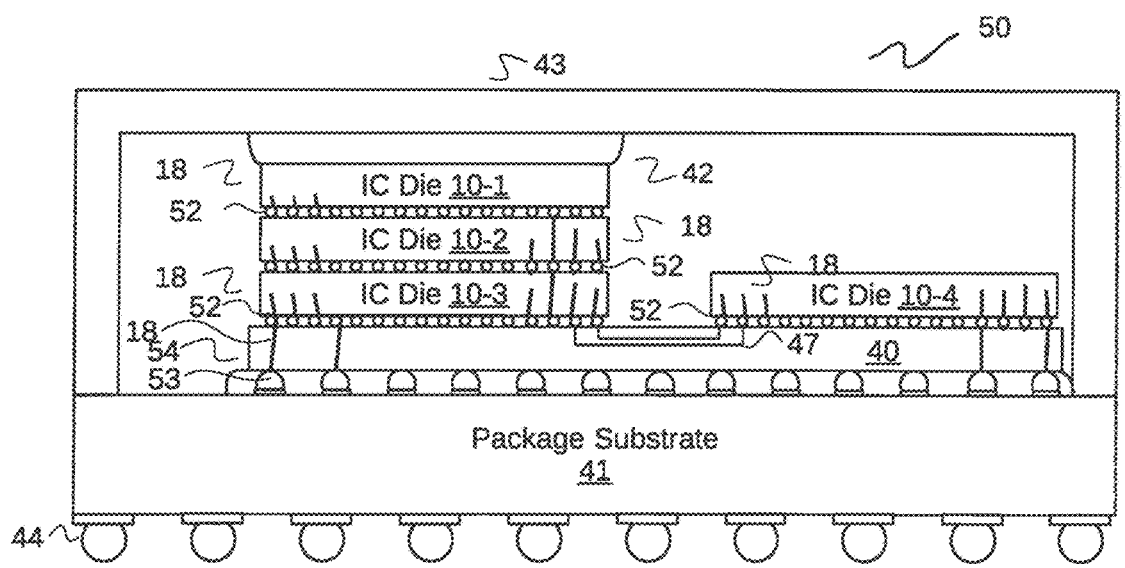
FIG. 2B is a block diagram of a cross-sectional view depicting another exemplary 3D IC packaged component with via structures.

FIG. 2B is a block diagram of a cross-sectional view depicting another exemplary 3D IC packaged component 50 with via structures 18. 3D IC packaged components 50 of FIGS. 2A and 2B are the same except for the following differences; in FIG. 2B, another IC 10-4 is separately coupled via microbumps 52 to interposer 40, where IC 10-4 is not coupled in the stack of ICs 10-1, 10-2, and 10-3. Furthermore, interposer 40 includes metal and via layers for providing wires 47 for interconnecting ICs 10-3 and 10-4. Furthermore, interposer 40 includes via structures 18 coupled to IC 10-4 through microbumps 52.

3D wafer-level packaging ("3D-WLP") may be used for interconnecting two or more ICs, one or more ICs to an interposer, or any combination thereof, where interconnects thereof may use via structures 18. Optionally, ICs may be interconnected die-to-die ("D2D") or chip-to-chip ("C2C"), where interconnects thereof may use via structures 18. Further, optionally, ICs may be interconnected die-to-wafer ("D2W") or chip-to-wafer ("C2W") or wafer-to-wafer (WOW), where interconnects thereof may use via structures 18. Accordingly, any of a variety of die stacking or chip stacking approaches may be used to provide a 3D stacked IC ("3D-SIC" or "3D-IC").

Figure 3:
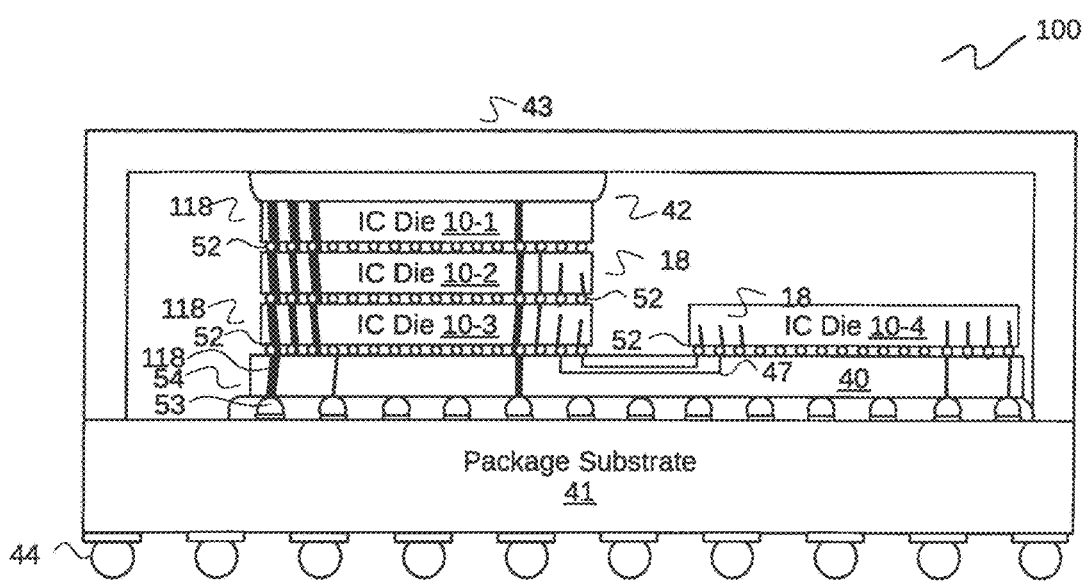
FIG. 3 is a block diagram of a cross-sectional view depicting exemplary 3D IC packaged component with via structures.

FIG. 3 is a block diagram of a cross-sectional view depicting exemplary 3D IC packaged component 100 with via structures. Again, 3D IC packaged component 100 includes multiple dies, such as for a system-in-a-package ("SiP") or an interposer, namely generally for one or more dies used for or in D2D, W2D, or WLP interconnections for forming a 3D IC. Along those lines, the particular configuration illustratively depicted in this example in FIG. 3 may, though need not, be used. This example is provided for purposes of clarity by way of example and not limitation, as it shall become apparent that a more or less complex configuration may be used.

For a 3D stacked IC, there is at least a first die and a second die interconnected to one another through die-to-die interconnects. For example, there may be at least an IC die 10-1 interconnected to an IC die 10-2 through microbumps 52. Or, for example, there may be at least an interposer 40 and an IC die 10-3 interconnected to one another through microbumps 52. IC dies 10-1 through 10-3, as well as substrate 40, may each have thermal via structures ("thermal vias") 118 for conducting heat in a generally vertical direction in 3D IC packaged component 100. Along those lines, heat may be conducted from one die to another die in a 3D stacked IC, and such heat may be provided to a heat sink, such as for example to thermal paste 42 and then to heat sink or heat spreader 43. In this example, heat sink 43 is part of 3D IC packaged component 100; however, in another configuration, an external heat sink may be coupled to heat sink 43. Furthermore, a 3D stacked IC may be encapsulated, and in such configuration thermal paste 42 may be provided to an outer surface of such encapsulation for thermal conduction and adhesion of an external heat sink.

Furthermore, one or more dies may have via structures 18 which are for conducting a signal, a supply power or supply voltage, or a ground. With respect to a ground, such via structures 18 may be both signal vias and thermal vias. For purposes of clarity and not limitation, via structures as described below are identified according to their purpose, such as either thermal vias or signal vias; however, in instances where vias are grounds used for grounding and thermally conducting, such vias may be identified as signal vias coupled for thermal conduction.

Via structures 118 are through die vias, as they extend between an upper and a lower surface of a die. Via structures 118 may include through substrate vias, as described below in additional detail.

With the above understanding in mind, various configurations of 3D stacked ICs are further described. FIGS. 4A through 4G are schematic diagrams of cross-sectional views depicting an exemplary portion of a successively processed in-process IC die 400. IC die 400 may be for a 3D stacked IC.

Figure 4A:
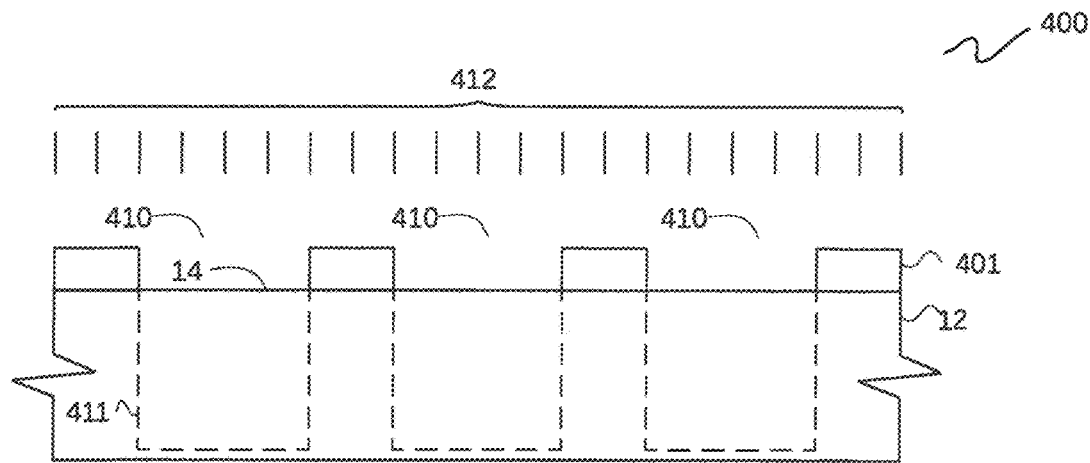
FIGS. 4A through 4G are schematic diagrams of cross-sectional views depicting an exemplary portion of a successively processed in-process IC die.

With reference to FIG. 4A, a masking layer 401 is deposited and patterned on an upper surface 14 of a substrate 12. Masking layer 401 is patterned to provide openings 410. In this example, openings 410 on the right and left are for forming respective signal vias, and opening 410 in the center is for forming a thermal via. However, other combinations and/or other numbers of openings 410 may be used in other implementations. An etch 412 may be used to form openings 411 in substrate 12 corresponding to openings 410, as generally indicated by dashed lines. For purposes of clarity by way of example and not limitation, it shall be assumed that substrate 12 is a silicon substrate and that etch 412 is a timed etch for anisotropically etching silicon; however, in other implementations another material or materials may be used for substrate 12 and/or a less anisotropic etch may be used.

Figure 4B:
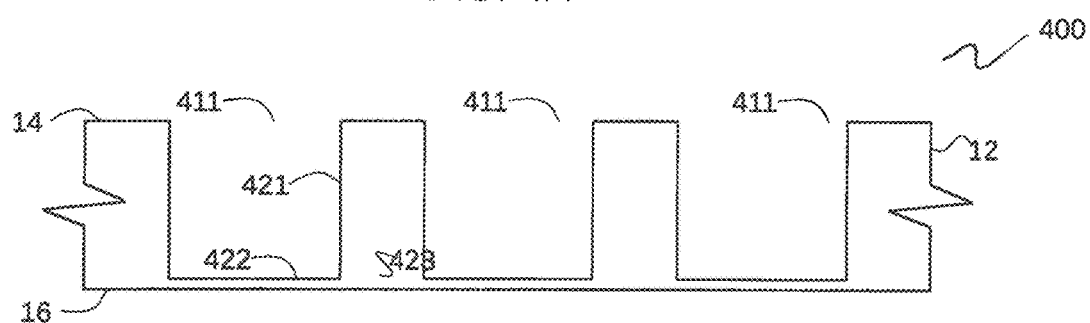

With reference to FIG. 4B, substrate 12 has openings 411 formed therein. Openings 411 each have one or more sidewalls and a bottom surface or area generally depending upon a resulting geometric or other volumetric shape of such openings. For purposes of clarity by way of example and not limitation, it shall be assumed that openings 411 are generally cylindrical with a sidewall surface 421 and a base surface 422; however, other volumetric shapes may be used in other implementations. Base surface 422 is substantially below upper surface 14 and is proximate to a lower surface 16. However, an offset region 423 of material of substrate 12 may be located between base surface 422 and lower surface 16.

Figure 4C:
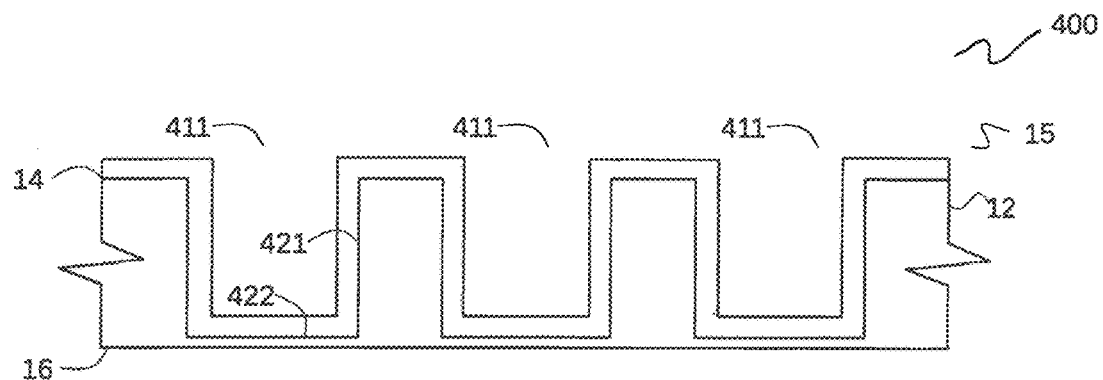

With reference to FIG. 4C, a liner layer or liner 15 is deposited onto substrate 12. Generally, liner 15 is deposited onto upper surface 14, as well as on base surface 422 and along sidewall surface 421 of each of openings 411. Though a conformal deposition of liner 15 is illustratively depicted in this example, in other implementations a less conformal deposition may be used.

Figure 4D:
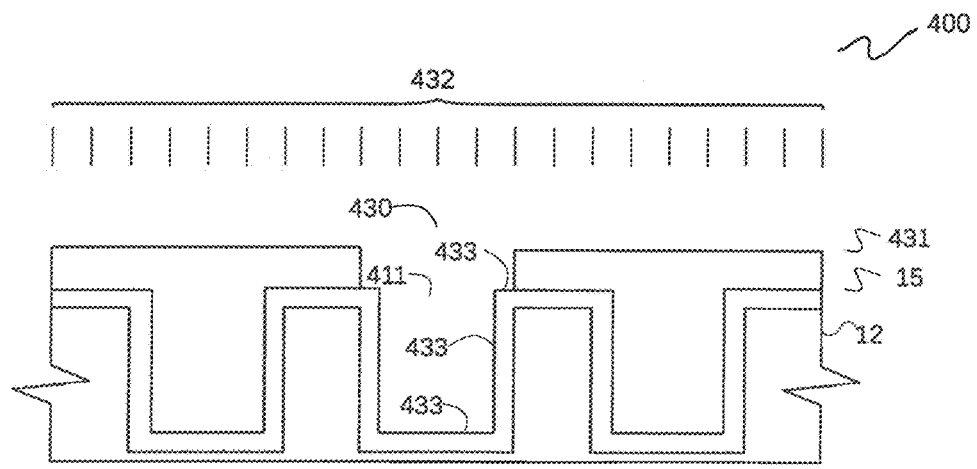

With reference to FIG. 4D, a masking layer 431 is deposited and patterned on an upper surface 433 of liner 15. Masking layer 431 is patterned to have an opening 430 respectively corresponding to each thermal via to be formed. Along those lines, an opening 411 for a thermal via is patterned to remove resist of masking layer 431 therefrom. In this example, an upper surface 433 portion of liner 15 corresponding to sidewall surface 421 and base surface 422, namely corresponding to opening 411 in substrate 12, is exposed after patterning of opening 430. In other words, masking layer 431 fills all openings 411 in covering an upper surface 433 of liner 15, and fills and then has removed therefrom resist from each thermal via opening 411.

An etch 432 to remove a portion of liner 15 exposed by patterned masking layer 431 may be performed. For purposes of clarity by way of example and not limitation, it shall be assumed that liner 15 is a silicon-dioxide ($SiO_2$) removable by an oxide etch, such as a buffered oxide etch ("BOE") or buffered hydrofluoric acid ("BHF" or "HF") etch for example; however, other materials for liner 15 and/or other types of etches may be used in other examples. Other examples of liner 15 material may include a silicon oxide, a silicon nitride, or another dielectric material may be used to electrically isolate via structures 18 from substrate 12. Liner 15 may have a thermal conductivity value equal to or less than approximately 3 W/(m K). However, for a thermal via structure, electrical isolation from a liner 15 may be omitted as a thermal via structure is generally not used for electrical conduction.

Figure 4E:
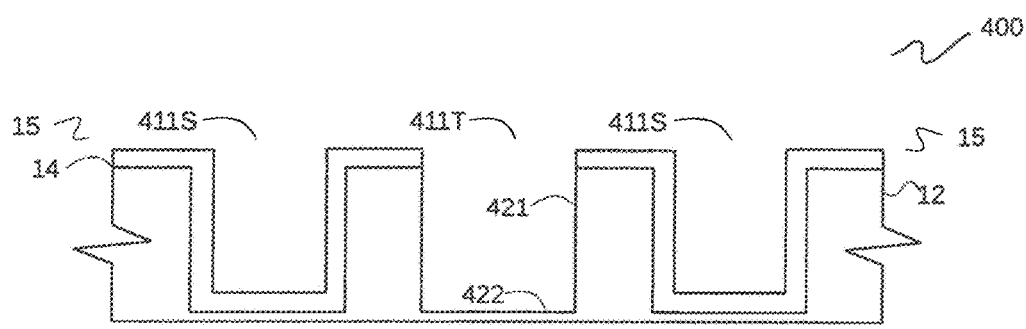

With reference to FIG. 4E, masking layer 431 has been removed after completion of etch 432. Sidewall surface 421 and base surface 422 of an opening 411T for a thermal via are exposed, while those surfaces of openings 411S for a signal via are covered by liner 15. Additionally, liner 15 may cover upper surface 14 of substrate 12.

Figure 4F:
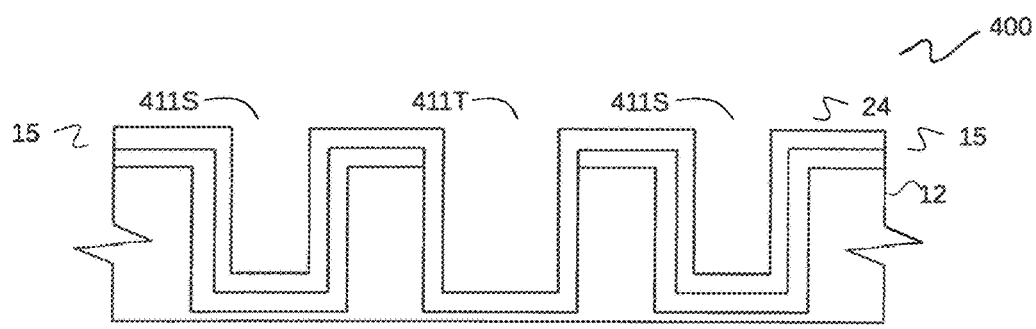

With reference to FIG. 4F, a barrier layer 24 is deposited on liner 15 and onto surfaces 421 and 422 of opening 411T. Barrier layer 24 may provide sufficient protection against diffusion of a thermally conductive material, as described below in additional detail, into substrate 12. Though a conformal deposition of barrier layer 24 is illustratively depicted in this example, in other implementations a less conformal deposition may be used. Thus, signal via openings 411S may have therein a stack of a liner 15 and a barrier layer 24, and thermal via opening 411T may have just a barrier layer 24 therein.

Figure 4G:
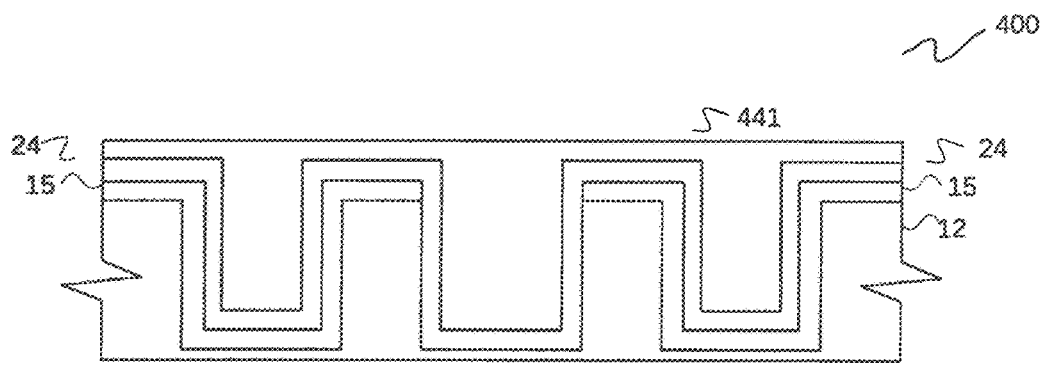

With reference to FIG. 4G, a conductor layer 441 for via conductors 21 may be deposited onto barrier layer 24. Via conductor 21 may be as previously described herein, and such via conductor layer 441 may fill openings 411S and 411T, as well as be deposited on an upper surface of barrier layer 24. It is not necessary that the conductive layer 441 completely fill openings 411S and 411T, as voids may be allowed for example. Again, in various examples, a via conductor 21 may generally consist of copper or a copper alloy. However, a via conductor 21 may additionally or alternatively include one or more other conductive materials such as tantalum, nickel, titanium, molybdenum, tungsten, aluminum, gold, silver, or solder, including various alloys or compounds of one or more of the these materials, and the like. A via conductor 21 may include non-metallic additives to control various environmental or operational parameters of a via structure.

Figure 5A:
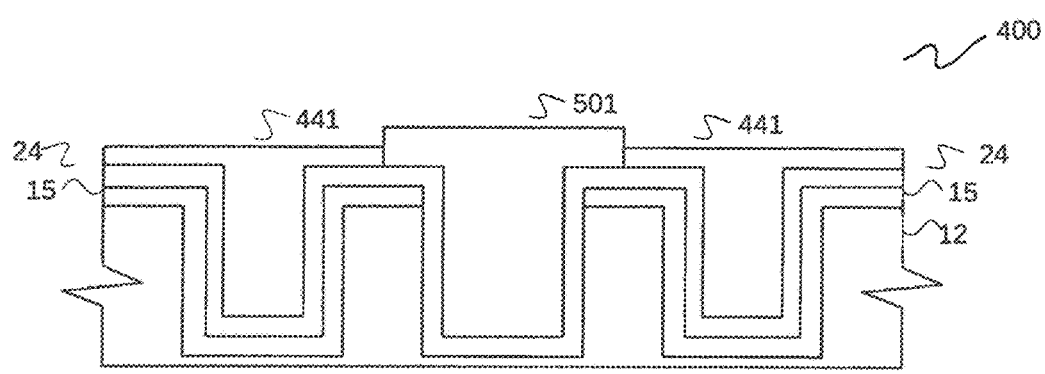
FIGS. 5A and 5B are schematic diagrams of cross-sectional views depicting an exemplary portion of the successively processed the in-process IC die of FIG. 4G.
Figure 5B:
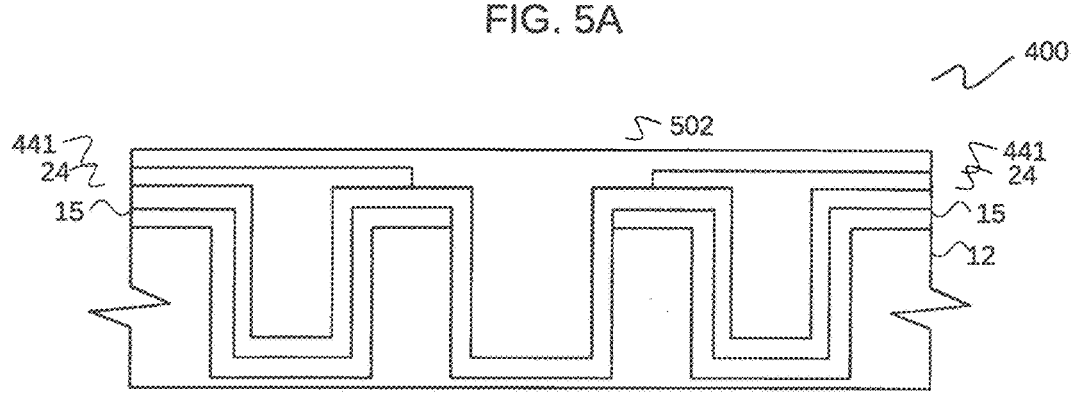

FIGS. 5A and 5B are schematic diagrams of cross-sectional views depicting an exemplary portion of the successively processed in-process IC die 400 of FIG. 4G. A thermal via structure need not be electrically conductive in comparison to a signal via structure. Because thermal via structures do not have to be formed of the same material or materials of signal via structures, rather than deposition of a conductive layer 441 as described with reference to FIG. 4G, a masking layer 501 may be deposited and patterned prior to such deposition of conductive layer 441. In this example, such masking layer 501 is deposited and patterned to fill opening 411T, and thus deposition of a conductive layer 441 may fill openings 411S without filling already filled opening 411T. In another implementation, masking layer 501 may be deposited and patterned to fill openings 411S for deposition of a conductive layer 441 to fill opening 411T.

Such masking layer 501 may then be removed, and following such removal a conductive layer 502 may be deposited to fill opening 411T. Along the above lines, if a thermally conductive material disposed in a thermal via structure is not a diffusion or migration risk with respect to contamination of substrate 12, then barrier layer 24 in such thermal via structure may be omitted. However, for purposes of clarity by way of example and not limitation, it shall be assumed that both thermal and signal via structures have a common via conductor 21 material, and thus it shall be assumed that the configuration of FIG. 4G is used in the following description. However, it shall be apparent that the following description applies equally to the configuration of FIGS. 5A and 5B.

Figure 6A:
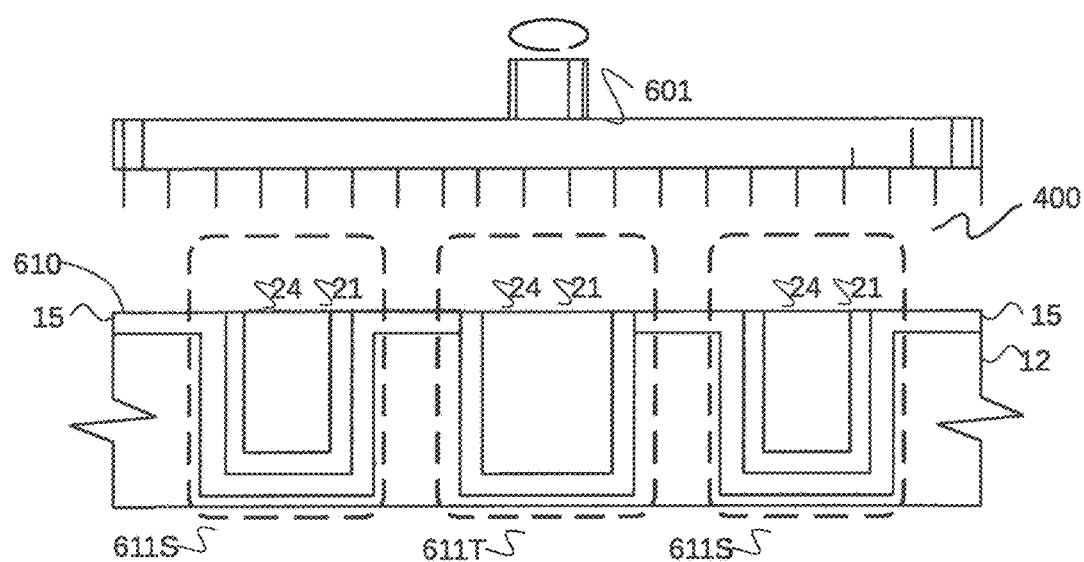
FIGS. 6A and 6B are schematic diagrams of cross-sectional views depicting an exemplary portion of the in-process IC die of FIG. 4G after respective polishing operations.

FIG. 6A is a schematic diagram of a cross-sectional view depicting an exemplary portion of in-process IC die 400 of FIG. 4G after a CMP operation 601. CMP operation 601 may be used to remove conductive material of conductive layer 441 and barrier material of barrier layer 24 generally disposed above an upper surface 610 of liner 15, as illustratively depicted. Accordingly, via structures 611 corresponding to openings 411 may remain after CMP operation 601. More particularly, signal via structures 611S may correspond to signal via openings 411S, and thermal via structures, such as thermal via structure 611T for example, may correspond to thermal via openings, such as thermal via opening 411T for example. Each thermal via structure 611T may include a barrier layer 24 and a via conductor 21, where such barrier layer 24 is positioned to at least substantially prevent diffusion or migration into substrate 12 of a material used to provide via conductor 21. In other words, a barrier layer 24 may be disposed in at least one of a plurality of vias to provide a thermal via structure 611T, where barrier layer 24 is disposed between a thermally conductive material of conductive layer 441 and substrate 12.

By thermally conductive material, it is generally meant a material, including without limitation a compound or other combination of two or more materials, having a thermal conductivity value equal to or greater than approximately 150 W/(mk) (i.e., higher than silicon for a silicon substrate). Generally, for such thermal conductivity, a thermal conductive material may include a metal. Such a metal may be selected from a group consisting of aluminum, copper, gold, silver, tungsten, and solder. However, in other implementations, such thermally conductive material may include a carbon-based material. For example, a carbon-based material may include graphene. For purposes of clarity by way of example and not limitation, it shall be assumed that such thermally conductive material is copper.

Figure 6B:
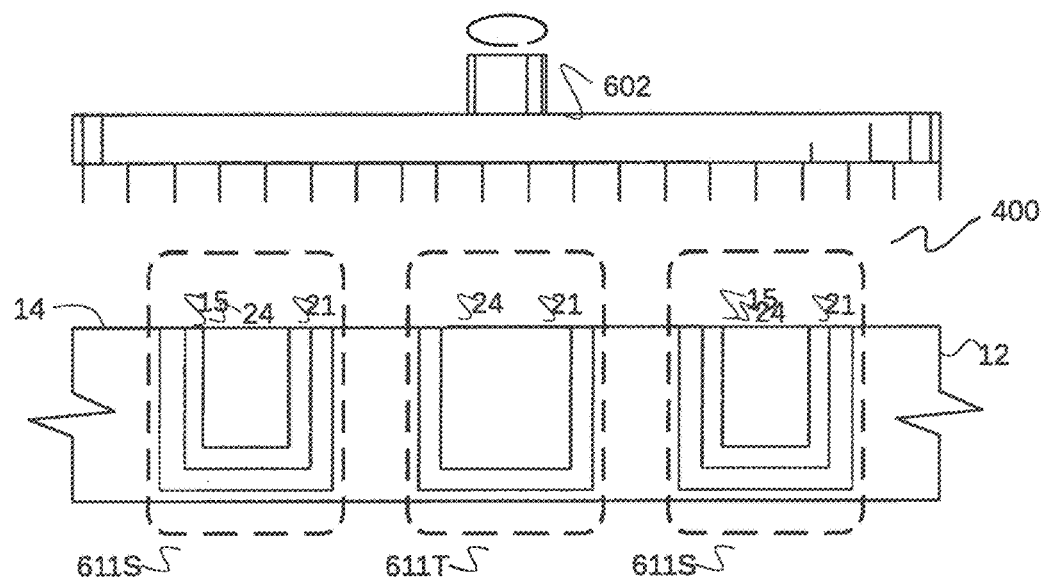

FIG. 6B is a schematic diagram of a cross-sectional view depicting an exemplary portion of in-process IC die 400 of FIG. 4G after a CMP operation 602. CMP operation 602 may be used to remove conductive material of conductive layer 441, barrier material of barrier layer 24, and liner material of liner 15 generally disposed above an upper surface 14 of substrate 12, as illustratively depicted. Along those lines, CMP operation 602 may be an extension of CMP operation 601.

Accordingly, via structures 611 corresponding to openings 411 may remain after CMP operation 602. More particularly, signal via structures 611S may correspond to signal via openings 411S, and thermal via structures, such as thermal via structure 611T for example, may correspond to thermal via openings, such as thermal via opening 411T for example. Each thermal via structure 611T may include a barrier layer 24 and a via conductor 21, where such barrier layer 24 is positioned to at least substantially prevent diffusion or migration into substrate 12 of a material used to provide via conductor 21. In other words, a barrier layer 24 may be disposed in at least one of a plurality of vias to provide a thermal via structure 611T, where barrier layer 24 is disposed between a thermally conductive material of conductive layer 441 and substrate 12.

Figure 6C:
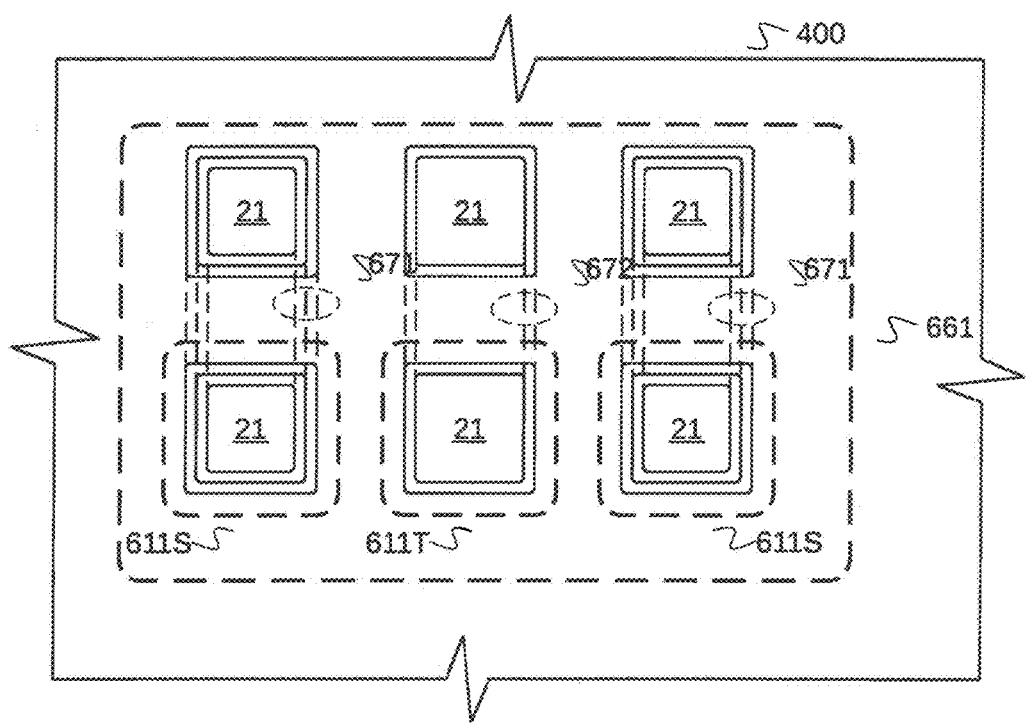
FIG. 6C is a schematic diagram of a top view depicting an exemplary portion of an in-process IC die of FIG. 6B.

FIG. 6C is a schematic diagram of a top view depicting an exemplary portion of an in-process IC die 400 of FIG. 6B. Sets of via structures 611S and 611T may be formed in an array 661. Even though concentric squares with rounded corners are illustratively depicted for a top view of layers of via structures 611S and 611T, other shapes, such as circles, ellipses, rectangles, polygons, or other shapes, may be used. Furthermore, the numbers of via structures 611S and 611T may be fewer or more than those illustratively depicted. Additionally or optionally, channels, such as generally indicated by dashed lines 671 and 672, may be formed for via structures 611S and 611T. Along those lines, an array of channels may be formed for vias. Furthermore, structures other than or including channels may be used, such as concentric rings, zigzags, or other geometric forms. Furthermore, vias structures 611S and 611T may, though need not be, completely filled. For example, vias 411S and 411T may be conformally plated leaving voids in via conductors 21 of vias structures 611S and/or 611T.

To recapitulate, a substrate 12 may have formed therein vias, where a subset of the vias do not having a liner layer located therein. A thermally conductive material may be deposited in all of the vias to provide signal and thermal via structures.

Thermal conductivity of barrier layer 24 may be small in comparison to thermal conductivity of via conductor 21. Barrier layer 24 may have a thermal conductivity value in a range of approximately 5 W/(mK) to 70 W/(mK). For this example, barrier layer 24 has a higher thermal conductivity than liner 15, and thermal conductivity of liner 15 may thus be generally less than such lower bound of this range. Again, examples of materials for barrier layer 24 may include tantalum (Ta), tantalum nitride (TaN), palladium (Pd), titanium nitride (TiN), TaSiN, compounds of Ta, compounds of Ti, compounds of nickel (Ni), compounds of copper (Cu,), compounds of cobalt (Co), or compounds of tungsten (W), among others.

Figure 7A:
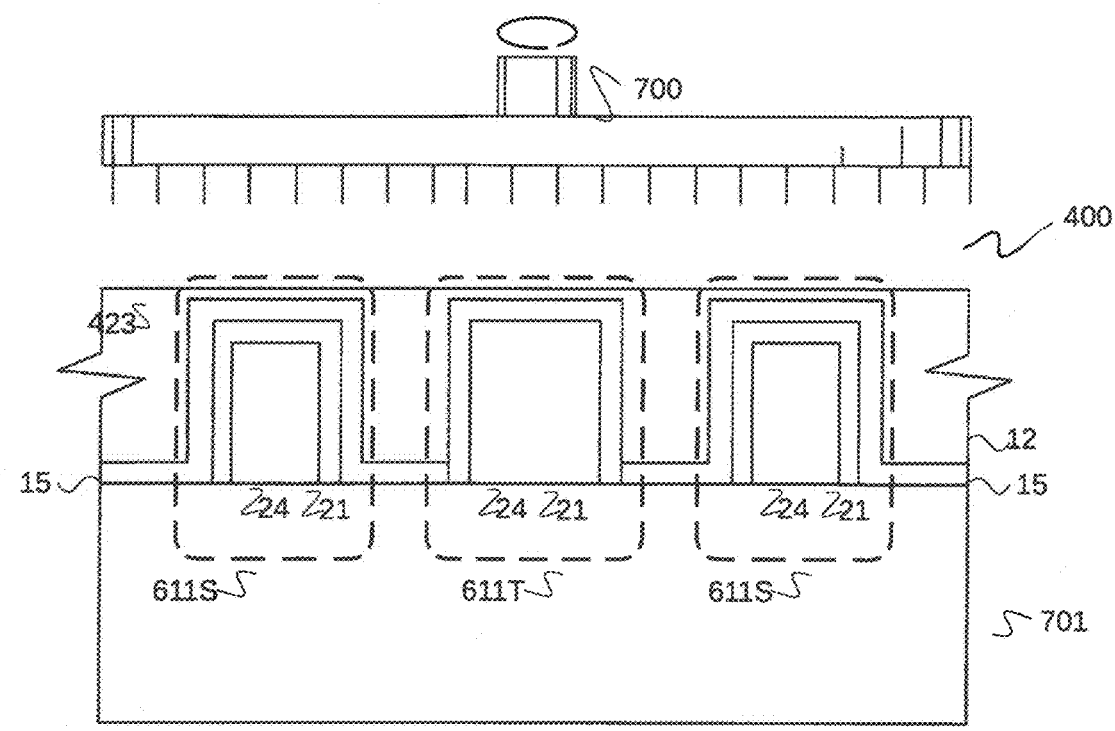
FIGS. 7A and 7B are schematic diagrams of cross-sectional views depicting an exemplary portion of the in-process IC die of FIG. 6A prior to and after, respectively, a backside reveal polishing operation.
Figure 7B:
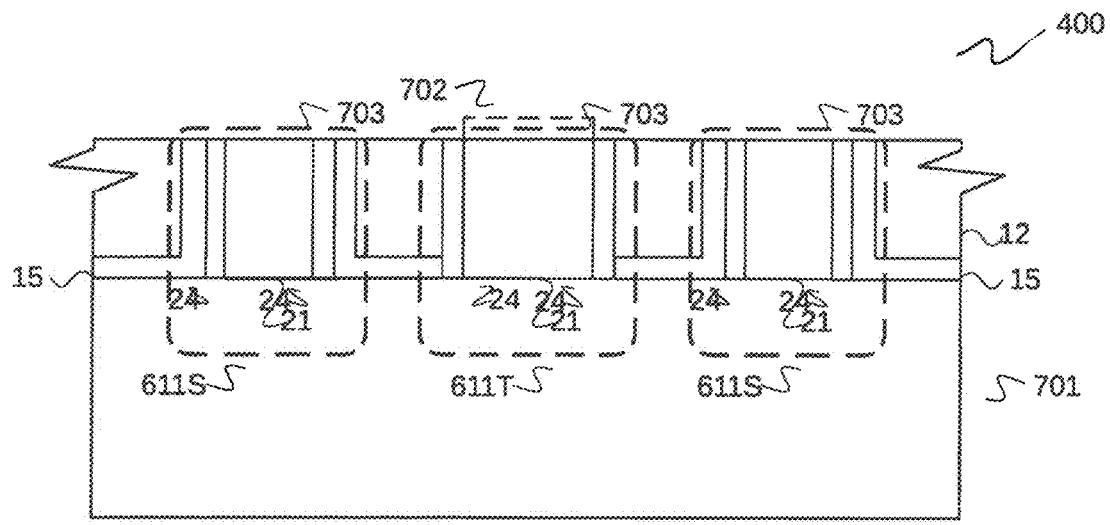

FIGS. 7A and 7B are schematic diagrams of cross-sectional views depicting an exemplary portion of in-process IC die 400 of FIG. 6A prior to and after, respectively, a backside reveal CMP operation 700. For purposes of clarity by way of example and not limitation, it shall be assumed that wafer includes a fabricated multi-layered structure ("substrate") 12 with generally any and all BEOL and FEOL processing operations having been completed generally for providing an IC die 400 of FIG. 7A. In passive die configurations, such as a passive interposer for example, there may not be any FEOL processing operations. As used above, substrate 12 of FIG. 4A for example was a single layer. However, more generally a substrate may be a single layer or multiple layers used to form a passive or active component. Along those lines, a semiconductor die may be referred to as a substrate. Again, for purposes of clarity by way of example and not limitation, it shall be assumed that a BEOL layer or an RDL metal layer ("metal layer") has been formed on an upper surface of substrate 102 as part of in-process wafer.

Layers associated with BEOL operations are generally depicted as block 701 for purposes of clarity and not limitation. In-process IC die 400 is illustratively depicted as inverted for this backside reveal. CMP operation 700 may be used to remove a portion of substrate 12, namely offset region 423 of material of substrate 12, as well as lower portions (illustratively depicted as upper portions) of liner 15 and barrier layer 24 to expose lower surfaces 703 of each of via conductors 21. With this removal, a lower portion 702 of via conductor 21 may be removed from thermal via structure 611T, due to the absence of a liner layer 15 in a thermal via opening 411T. Subsequent die-level or wafer-level processing may follow. Again, a wafer may be for one or more dies of a system-in-a-package ("SiP") or an interposer, namely generally for one or more dies used for or in D2D, W2D, or WLP interconnections for forming a 3D IC using IC die 400.

It should be appreciated that for liner 15 formed of $Si_3N_4$ or $SiO_2$, such thermal conductivity is approximately 0.7 and 1.3 W/(mK), respectively. Avoidance of such liner 15 from a thermal via structure may thus improve thermal conductivity by removing such thermally insulating material, but also in effect such removed material may be replaced at least partially with a thermally conductive material to further enhance thermal conductivity of a thermal via structure. Additionally, to the extent that by volume barrier layer 24 in a thermal via structure is increased, such barrier layer 24 material has a higher thermal conductivity than a liner 15 material. For example, Ta, Ti, TiN, TaN, and ZrN respectively have thermal conductivities of approximately 57.5, 21.9, 19.2, 8.8, and 7 W/(mK).

Figure 8:
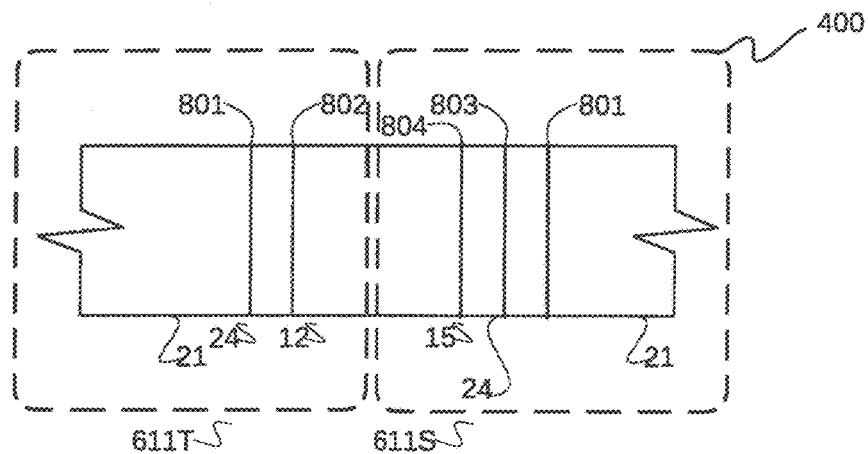
FIG. 8 is a schematic diagram of a cross-sectional view of a portion of the IC die of FIG. 7B.

FIG. 8 is a schematic diagram of a cross-sectional view of a portion of an IC die 400 of FIG. 7B. For a signal via structure, there is a substrate 12-to-liner 15 interface 804, a liner 15-to-barrier layer 24 interface 803, and a barrier layer 24-to-via conductor 21 interface 801. For a thermal via structure, there is a substrate 12-to-barrier layer 24 interface 802, as well as a barrier layer 24-to-via conductor 21 interface 801. These interfaces 801 through 804 may have thermal resistances in addition to thermal resistances of the materials associated therewith. However, for a highly thermally conductive via conductor 21, thermal resistance thereof may be small enough in comparison to these other thermal resistances to be excluded from a thermal resistance determination.

Along the above lines, thermal resistance of a signal via structure 611S may be approximated as a sum of thermal resistances of interface 801, barrier layer 24, interface 803, liner 15, interface 804, and substrate 12. Likewise, thermal resistance of a thermal via structure 611T may be approximated as a sum of thermal resistances of interface 801, barrier layer 24, interface 802, and substrate 12. Accordingly, thermal resistance of a thermal via structure 611T may be substantially less than thermal resistance of a signal via structure 611S. A thermal via structure 611T may form a portion of a through die thermal via 118 of FIG. 3 of an IC die 400.

Even if thermal resistances of interfaces of via structures 611S and 611T are ignored for purposes of comparison, removing liner 15 to provide a thermal via structure 611T still results in a significant reduction in thermal resistance as a function of distances from a via. For example, if thermal resistances of a barrier layer 24, a liner 15, and a substrate 12 total R, where R equals $R_b+R_l+R_s$, then a fraction indicating a change in R due to removal of a liner 15 may be expressed as:

$$\Delta R/R = R_l/(R_b+R_l+R_s).$$

Figure 9:
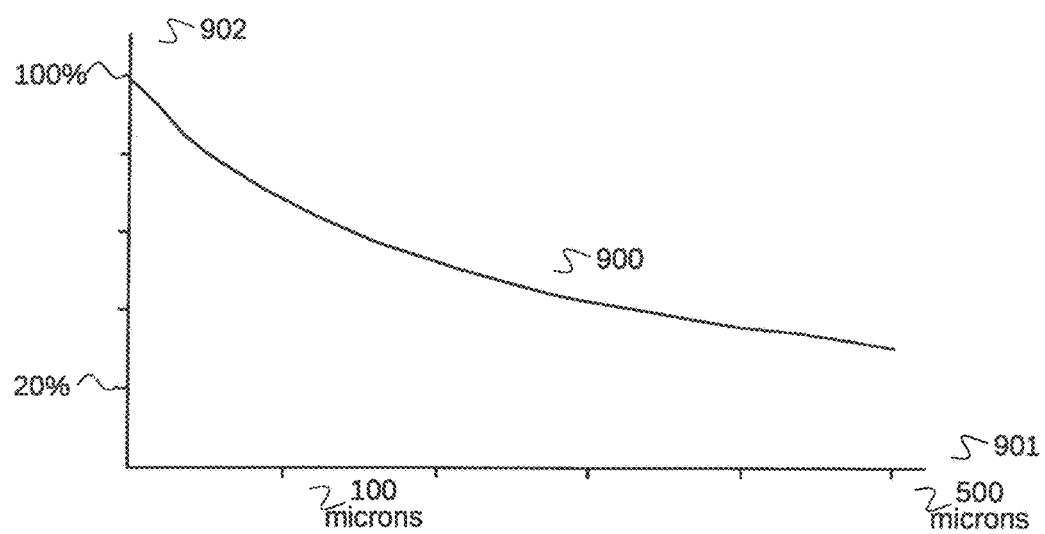
FIG. 9 is a graph depicting an exemplary function in accordance with a change in thermal resistivity over thermal resistivity ratio.

Because thermal resistance R may be expressed in terms of distance, L, divided by thermal conductivity k, each thermal resistance in the above equation may be replaced by a ratio L/k. Each L/k is particular to the thickness of a layer and the thermal conductivity of the material having such thickness. Along the above lines, FIG. 9 is a graph depicting an exemplary function 900 in accordance with the above-described change in thermal resistivity over thermal resistivity ratio. Function 900 relates to percentage of reduction in thermal resistance, namely y-axis 902, relative to distance from a thermal via structure, namely x-axis 901. In this example, even if a thermal via structure 611T is a distance of approximately 500 microns away from a hot spot on an IC die 400, reduction in thermal resistance is still significant, approximately 30%. This is just one example, and such results may vary from implementation-to-implementation due to materials used, configurations, and processes used, among other variables.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method, comprising:
   patterning a first masking layer deposited on an upper surface of a substrate to define a plurality of openings;
   etching the substrate through the plurality of openings to form corresponding via openings in the substrate;
   wherein each of the via openings include at least a sidewall surface and a base surface;
   removing the first masking layer;
   depositing a liner layer on the upper surface of the substrate and in the via openings on the sidewall surface and the base surface of each thereof;
   patterning a second masking layer deposited on the liner layer to define at least one opening corresponding to at least one of the via openings;
   wherein the at least one opening exposes a portion of the liner layer corresponding to the at least one of the via openings;
   etching the portion of the liner layer to expose the sidewall surface and the base surface of the at least one of the via openings;
   removing the second masking layer;
   depositing a barrier layer on the liner layer and on the sidewall surface and the base surface of the at least one of the via openings;
   depositing a thermally conductive material on the barrier layer;
   wherein the thermally conductive material is deposited in the via openings to provide signal via structures and at least one thermal via structure; and
   wherein the depositing of the thermally conductive material comprises depositing different thermally conductive materials for the signal via structures as compared with the at least one thermal via structure.

2. The method according to claim 1, further comprising polishing the thermally conductive material, the barrier layer, and the liner layer down to the upper surface of the substrate.

3. The method according to claim 1, further comprising polishing the thermally conductive material and the barrier layer down to an upper surface of the liner layer.

4. The method according to claim 1, further comprising polishing a lower surface of the substrate and the barrier layer for removal therefrom to temporarily expose a lower surface of the thermally conductive material in the at least one of the via openings to provide a corresponding at least one through substrate thermal via as the at least one thermal via structure.

5. The method according to claim 1, further comprising polishing a lower surface of the substrate, the barrier layer, and the liner layer for removal therefrom to temporarily expose a lower surface of the thermally conductive material in the via openings to provide the signal via structures and the at least one thermal via structure.

6. The method according to claim 1, wherein the thermally conductive material has a thermal conductivity value equal to or greater than approximately 150 W/(mK).

7. The method according to claim 6, wherein:
   the barrier layer has a thermal conductivity value in a range of approximately 5 to 70 W/(mK); and
   the liner layer has a thermal conductivity value equal to or less than approximately 3 W/(mK).

8. A method for forming an integrated circuit, comprising:
   forming openings in a substrate;
   forming a liner layer on sidewall and base surfaces in a first set of the openings;
   depositing a barrier layer on the liner layer in the first set of the openings and on sidewall and base surfaces in a second set of the openings;
   depositing a thermally conductive material on the barrier layer in the second set of the openings to provide a thermal via structure;

depositing an electrically conductive material on the barrier layer in the first set of the openings to provide a signal via structure; and wherein the thermally conductive material and the electrically conductive material are different materials with respect to one another.

9. The method according to claim 8, wherein the depositing of the thermally conductive material comprises:

masking the first set of the openings; and unmasking the first set of the openings after the depositing of the thermally conductive material.

10. The method according to claim 8, wherein the depositing of the electrically conductive material comprises:

masking the second set of the openings; and unmasking the second set of the openings after the depositing of the electrically conductive material.

11. The method according to claim 8, wherein the forming of the liner layer comprises:

depositing the liner layer on the sidewall and base surfaces of the first and the second set of the openings;

masking the first set of the openings;

removing the liner layer from the second set of the openings; and unmasking the first set of the openings.

12. The method according to claim 8, wherein the thermal via structure is not electrically conductive in comparison to the signal via structure.

13. The method according to claim 8, wherein the thermally conductive material has a thermal conductivity value equal to or greater than approximately 150 W/(mK).

14. The method according to claim 8, wherein the barrier layer has a thermal conductivity value in a range of approximately 5 to 70 W/(mK).

15. The method according to claim 8, wherein the liner layer has a thermal conductivity value equal to or less than approximately 3 W/(mK).

16. A method for forming an integrated circuit, comprising:

forming openings in a substrate;

forming a liner layer on sidewall and base surfaces in a first set of the openings;

depositing a barrier layer on the liner layer in the first set of the openings;

depositing a thermally conductive material on sidewall and base surfaces in a second set of the openings to provide a thermal via structure;

depositing an electrically conductive material on the barrier layer in the first set of the openings to provide a signal via structure; and wherein the thermally conductive material and the electrically conductive material are different materials with respect to one another.

17. The method according to claim 16, wherein:

the thermally conductive material is not a diffusion or migration risk with respect to contamination of the substrate; and the thermal via structure is not electrically conductive in comparison to the signal via structure.

18. The method according to claim 16, wherein the thermally conductive material has a thermal conductivity value equal to or greater than approximately 150 W/(mK).

19. The method according to claim 18, wherein the barrier layer has a thermal conductivity value in a range of approximately 5 to 70 W/(mK).

20. The method according to claim 19, wherein the liner layer has a thermal conductivity value equal to or less than approximately 3 W/(mK).

* * * * *